(12) United States Patent
Takatani et al.

(10) Patent No.: US 8,964,342 B2
(45) Date of Patent: Feb. 24, 2015

(54) COMPOUND SEMICONDUCTOR ESD PROTECTION DEVICES

(71) Applicant: WIN Semiconductors Corp., Kuei Shan Hsiang, Tao Yuan Shien (TW)

(72) Inventors: Shinichiro Takatani, Tao Yuan Shien (TW); Jung-Tao Chung, Tao Yuan Shien (TW); Chi-Wei Wang, Tao Yuan Shien (TW); Cheng-Guan Yuan, Tao Yuan Shien (TW); Shih-Ming Joseph Liu, Tao Yuan Shien (TW)

(73) Assignee: WIN Semiconductors Corp., Kuei Shan Hsiang, Tao Yuan Shien (TW)

( * ) Notice: Subject to any disclaimer, the term of this patent is extended or adjusted under 35 U.S.C. 154(b) by 7 days.

(21) Appl. No.: 13/732,003

(22) Filed: Dec. 31, 2012

(65) Prior Publication Data
US 2014/0183609 A1    Jul. 3, 2014

(51) Int. Cl.
*H02H 3/22*    (2006.01)
*H01L 27/02*    (2006.01)

(52) U.S. Cl.
CPC .................. *H01L 27/0248* (2013.01)
USPC ............................................. 361/56; 361/111

(58) Field of Classification Search
USPC ........................................... 361/56, 91.1, 111
See application file for complete search history.

(56) References Cited

U.S. PATENT DOCUMENTS

| | | | | |
|---|---|---|---|---|
| 5,461,265 A | * | 10/1995 | Kunihisa et al. | 307/98 |
| 6,642,578 B1 | * | 11/2003 | Arnold et al. | 257/341 |
| 7,881,030 B1 | * | 2/2011 | Li et al. | 361/56 |
| 2012/0001230 A1 | * | 1/2012 | Takatani | 257/194 |
| 2014/0084347 A1 | * | 3/2014 | Salcedo et al. | 257/195 |

* cited by examiner

*Primary Examiner* — Danny Nguyen
(74) *Attorney, Agent, or Firm* — Muncy, Geissler, Olds & Lowe, P.C.

(57) ABSTRACT

The present invention relates to compound semiconductor ESD protection devices using plural compound semiconductor E-FETs or compound semiconductor multi-gate E-FETs. The device comprises plural compound semiconductor E-FETs or multi-gate E-FETs, in which each of the gates is DC-connected to the source, drain, or an inter-gate region between two adjacent gates in the multi-gate E-FET through at least one first resistor, and at least one of the gates is AC-connected to the source, drain, or an inter-gate region between two adjacent gates in the multi-gate E-FET through a gate capacitor.

21 Claims, 15 Drawing Sheets

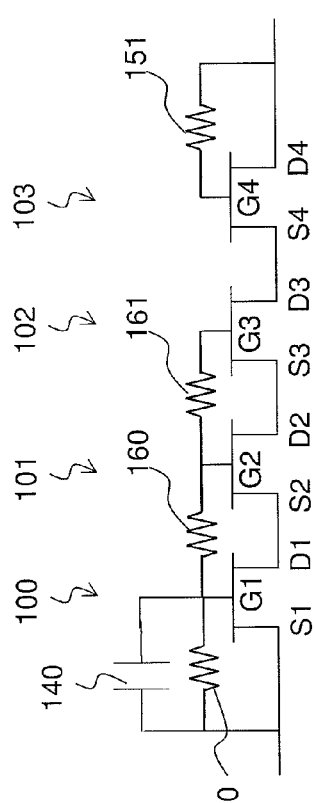
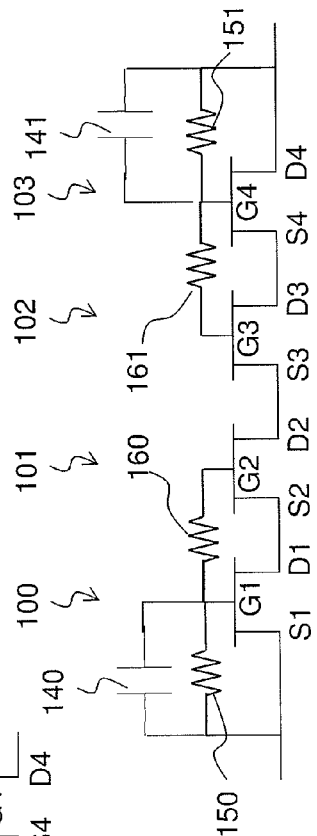
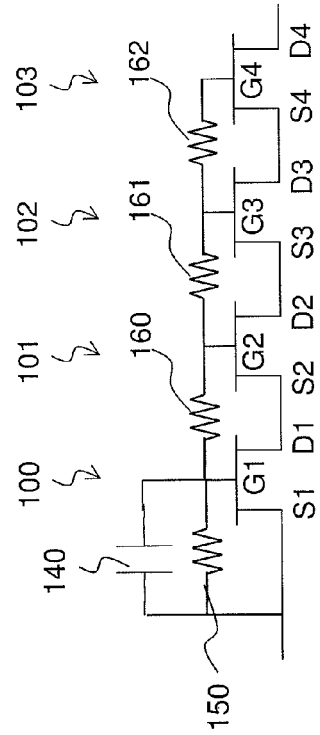
FIG. 1D
FIG. 1E
FIG. 1F

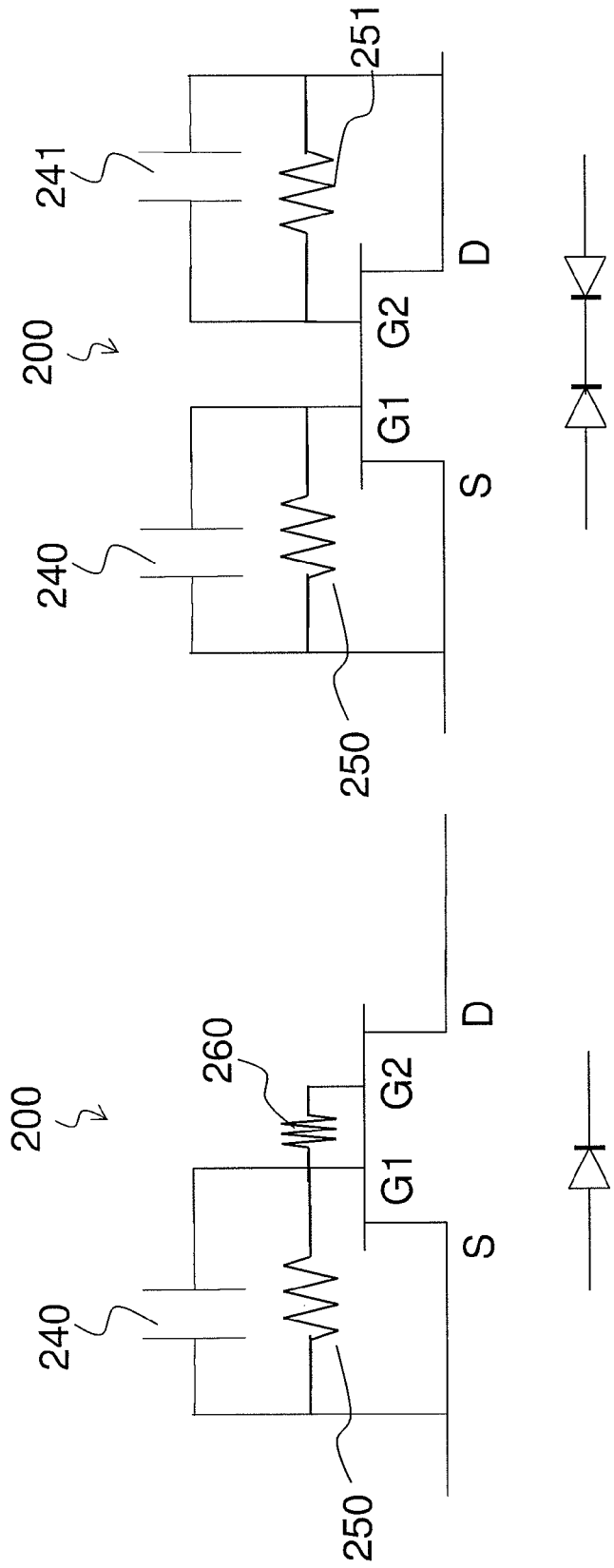

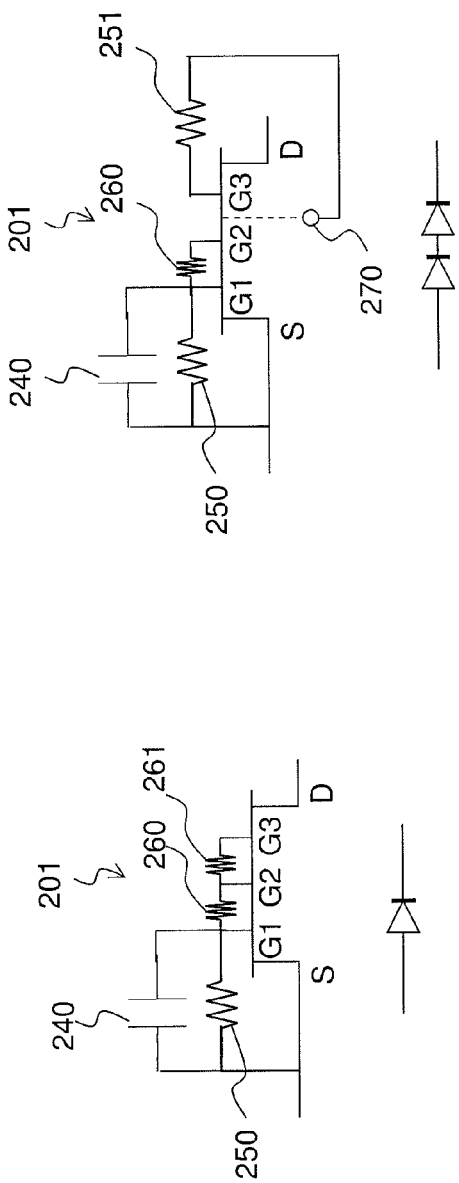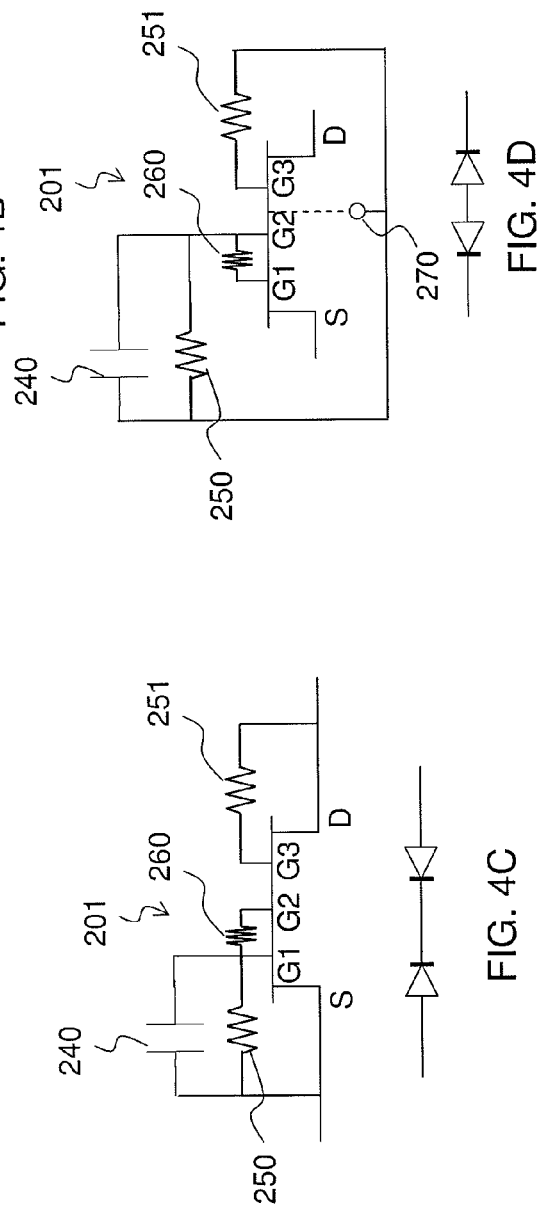
FIG. 4A  FIG. 4B  FIG. 4C  FIG. 4D

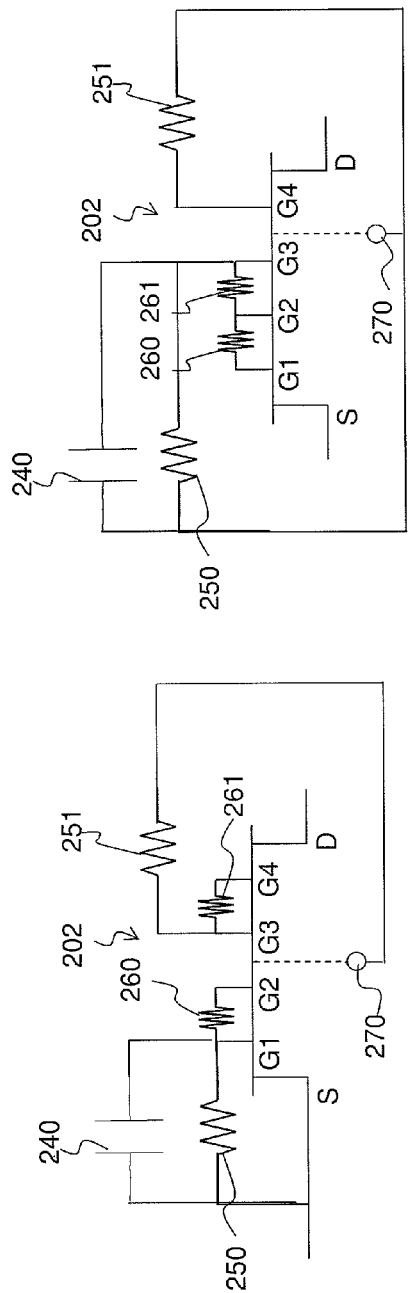
FIG. 6E
FIG. 6F
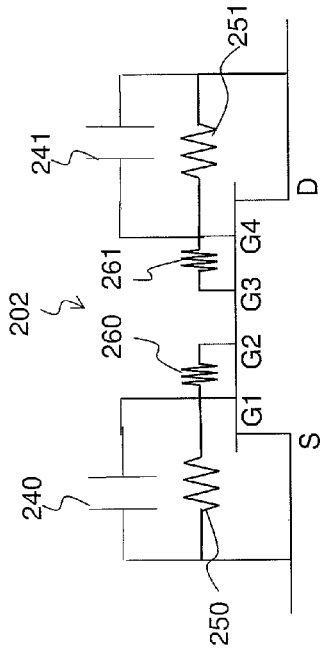
FIG. 6G
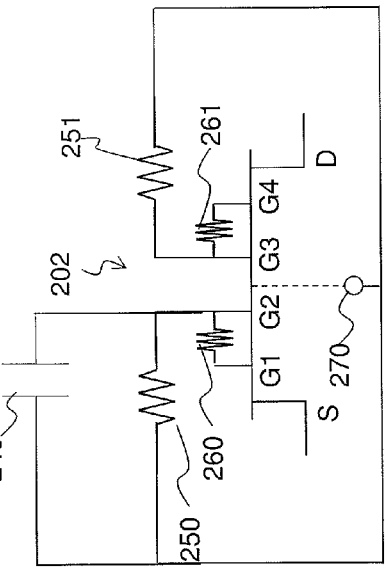
FIG. 6H

COMPOUND SEMICONDUCTOR ESD PROTECTION DEVICES

FIELD OF THE INVENTION

The present invention relates to compound semiconductor devices, and more particular to compound semiconductor electrostatic discharge protection devices.

BACKGROUND OF THE INVENTION

An integrated circuit (IC) connected to external terminals is vulnerable to electrostatic discharge (ESD) pulses from the operating environment and peripherals such as human bodies or machines. An ESD event may produce high current or high voltage pulses within a few nanoseconds, leading to device degradation or damage. In order to protect the vulnerable IC from ESD damaging pulses, an ESD protection circuit has to be connected to the external terminals of main IC elements.

Compound semiconductor devices have been widely used in the radio frequency (RF) circuits market. For example, compound semiconductor high electron mobility transistor (HEMT) switches have been widely applied in 3G cell phone applications in recent year for their high performance in RF range. However, the lack of good ESD protection devices has become a major drawback in HEMT switch applications. Conventionally, ESD protection circuits are made of series-connected diodes. A single enhancement-mode FET (E-FET) with the gate connected to the source with a resistor can act as a diode with different turn-on voltage for forward ($V_{on\_forward}$) and reverse bias voltage ($V_{on\_reverse}$), as shown in FIG. 9. The E-FET with a resistor connecting between its gate and source can be used as an ESD protection device. To meet the requirement of the circuit to be protected, the overall forward and reverse turn-on voltage of the diode can be modified by connecting the E-FET diodes in series in the same or opposite direction. By applying such an ESD protection device in a monolithic microwave and millimeter wave circuit comprising compound semiconductor E-FETs, the ESD protection device and other circuit elements can be formed on the same epitaxial structure. The problem of such an ESD protection device is that it often creates nonlinearity when the circuit is under an RF operation, particularly when the RF power is high. This results in the generation of harmonic distortions (HDs), intermodulation distortion (IMD), etc. The nonlinearity is induced because the gate voltage of the E-FET with respect to the source is near zero volts. Since the pinch-off voltage of the E-FET is usually small, the RF signal applied to the parasitic capacitance across the gate and the source ($C_{gs}$) and across the gate and the drain ($C_{gd}$) experiences the voltage-dependent capacitance, which is large in the sub-threshold voltage.

SUMMARY OF THE INVENTION

The main object of the present invention is to provide a compound semiconductor ESD protection device using plural compound semiconductor E-FETs or a compound semiconductor multi-gate E-FET, so that the ESD protection circuits for a compound semiconductor integrated circuit which comprises E-FETs can be integrated on the same chip. By using the on-chip ESD protection circuits, the size of a compound semiconductor IC module can be greatly reduced and the manufacturing process can be significantly improved.

Another object of the present invention is to provide a compound semiconductor ESD protection device using plural compound semiconductor E-FETs or a multi-gate E-FET, in which at least one of the gates is AC-connected to the source, drain, or an inter-gate region between two adjacent gates in the multi-gate E-FET through a gate capacitor. The gate capacitor is in parallel with the gate capacitance (denoted by $C_{gs}$) of the E-FET. The inclusion of the gate capacitor reduces the RF bias voltage across the $C_{gs}$ and the nonlinearity of the signal produced by $C_{gs}$, and therefore improves the linearity of the ESD device RF operation.

To reach the objects stated above, the present invention provides a compound semiconductor ESD protection device, which comprises plural single-gate E-FETs, at least one first resistor, and at least one gate capacitor. The plural single-gate E-FETs are connected in series. Each of the plural single-gate E-FETs comprises a source electrode, a drain electrode, and a gate electrode. The drain electrode of a single-gate E-FET is connected to the source electrode of a succeeding single-gate E-FET. The gate electrode of each of the plural single-gate E-FETs is DC-connected to the source or the drain electrodes of one of the plural single-gate E-FETs through the at least one first resistor. The gate electrode of at least one of the plural single-gate E-FETs is AC-connected to the source or the drain electrodes of one of the plural single-gate E-FETs through the at least one gate capacitor.

The present invention provides another compound semiconductor ESD protection device, in which the gate electrodes of two single-gate E-FETs among the plural single-gate E-FETs of the compound semiconductor ESD protection device described above are connected by a second resistor.

Furthermore, the present invention provides a compound semiconductor ESD protection device, which comprises a multi-gate E-FET, at least one first resistor, and at least one gate capacitor. The multi-gate E-FET comprises a source electrode, a drain electrode, and plural gate electrodes disposed between the source and drain electrodes. Each of the plural gate electrodes is DC-connected to the source electrode, the drain electrode, or the inter-gate region between two adjacent gate electrodes through the at least one first resistor. At least one of the plural gate electrodes is AC-connected to the source electrode, the drain electrode, or the inter-gate region between two adjacent gate electrodes through the at least one gate capacitor.

Moreover, the present invention provides another compound semiconductor ESD protection device, in which two gate electrodes among the plural gate electrodes of the compound semiconductor ESD protection device described above are connected by a second resistor.

In implementation, the multi-gate E-FET can be a GaAs FET.

In implementation, the GaAs multi-gate enhancement mode FET can be a high electron mobility transistor (HEMT) or a pseudomorphic high electron mobility transistor (pHEMT).

In implementation, said multi-gate E-FET can be a GaN FET.

In implementation, the source and drain electrodes are multi-finger electrodes interposed each other, and the plural gate electrodes can be multi-finger electrodes interposed each other disposed between the source and drain electrodes.

In implementation, the source and drain electrodes are multi-finger electrodes interposed each other, and the plural gate electrodes can be meandering gate electrodes disposed between the source and drain electrodes.

In implementation, the width of each gate electrode of the plural gate electrodes is ranging from of 0.1 mm to 10 mm.

In implementation, the resistance of the first and the second resistors is ranging from $2 \times 10^2$ to $2 \times 10^4$ ohms.

In implementation, the capacitance of the gate capacitor is ranging from 0.5 to 5 pF.

The present invention will be understood more fully by reference to the detailed description of the drawings and the preferred embodiments below.

BRIEF DESCRIPTION OF DRAWINGS

FIG. 1A~1G are circuit diagrams showing embodiments of a compound semiconductor ESD protection device using plural single-gate FETs provided by the present invention.

FIGS. 2A and 2B are circuit diagrams showing embodiments of a compound semiconductor ESD protection device using a dual-gate FET provided by the present invention.

FIG. 4A~4D are circuit diagrams showing embodiments of a compound semiconductor ESD protection device using a triple-gate FET provided by the present invention.

FIG. 6A~6H are circuit diagrams showing embodiments of a compound semiconductor ESD protection device using a quadruple-gate FET provided by the present invention.

DETAILED DESCRIPTIONS OF PREFERRED EMBODIMENTS

Figure 1A:
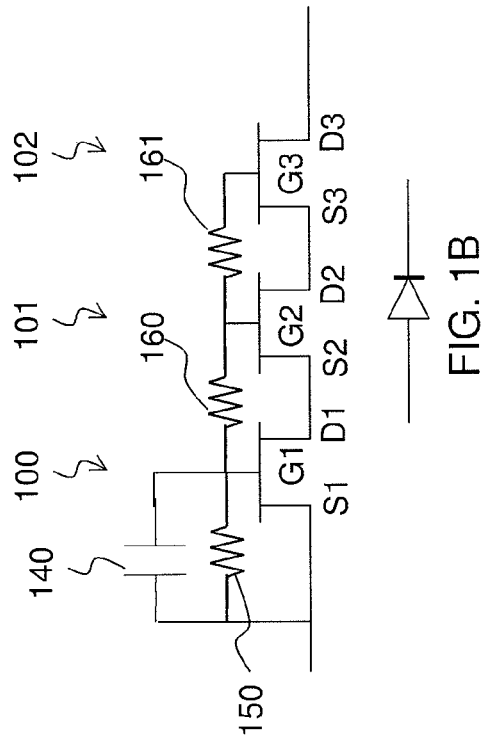
Figure 1B:
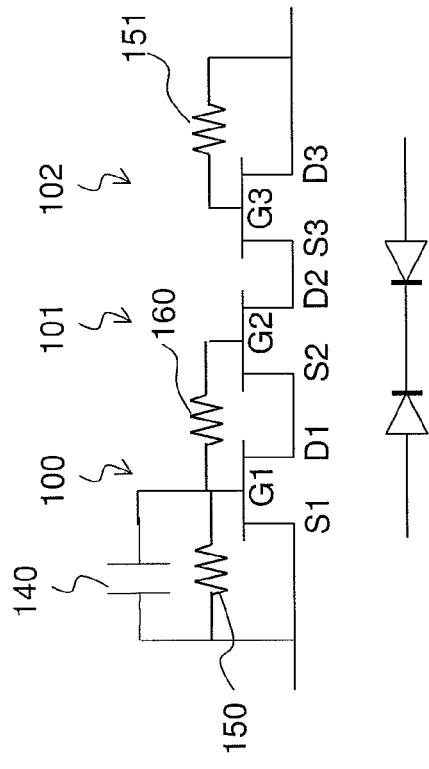
Figure 1C:
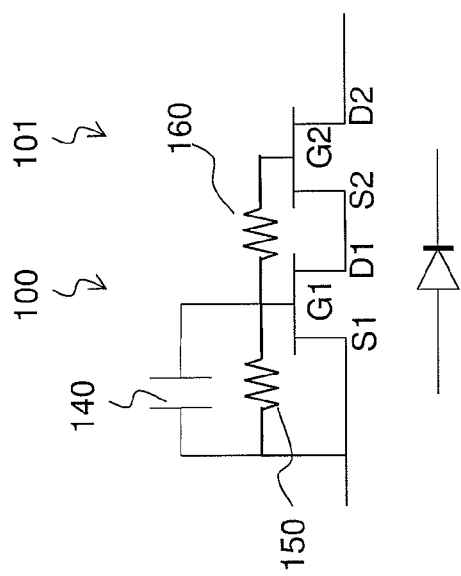
Figure 1G:
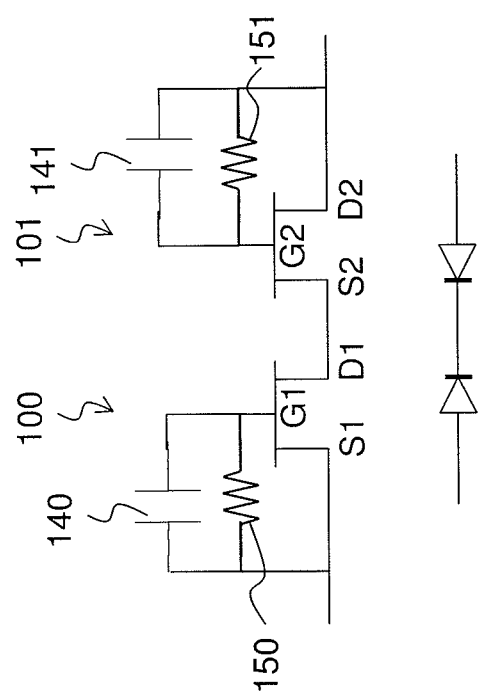

1. ESD Protection Devices Using Plural Single-Gate E-FETs

FIG. 1A~1G are circuit diagrams showing the embodiments of a compound semiconductor ESD protection device using plural single-gate E-FETs provided by the present invention. An equivalent diode or diodes connection is shown on the bottom of each figure. The ESD protection device comprises plural single-gate E-FETs (100~103), at least one first resistor (150 and 151), and at least one gate capacitor (140 and 141). The ESD protection device may further include at least one second resistor (160~162) for connecting the gate electrodes of two single-gate E-FETs. Each of the plural single-gate E-FETs comprises a source electrode (S), a drain electrode (D), and a gate electrode (G). The plural single-gate E-FETs are connected in series. The drain electrode of a single-gate E-FET is connected to the source electrode of a succeeding single-gate E-FET. The gate electrode of each of the plural single-gate E-FETs is DC-connected the source or the drain electrodes of one of said plural single-gate E-FETs through the at least one first resistor. At least one of the gate electrode of the plural single-gate E-FETs is AC-connected the source or the drain electrodes of one of said plural single-gate E-FETs through the gate capacitor. The word "connected" used throughout the specification includes either a direct connection or an indirect connection. For example, in FIG. 1A~1G, the gate electrode G1 is directly DC-connected to the source electrode S1 through the first resistor 150; in FIG. 1G, the gate electrode G2 is directly DC-connected to the source electrode S2 through the first resistor 151; whereas in FIG. 1A~1F, the gate electrode G2 is indirectly DC-connected to the source electrode S1 through the second resistor 160 and the first resistor 150; in FIGS. 1B, 1D, and 1E, the gate electrode G3 is indirectly DC-connected to the source electrode S1 through second resistors 160, 161 and the first resistor 150.

2. ESD Protection Devices Using Multi-Gate E-FETs

FIGS. 2A, 2B, 4A~4D, and 6A~6H are circuit diagrams showing the embodiments of a compound semiconductor ESD protection device using a multi-gate E-FET provided by the present invention. An equivalent diode or diodes connection is shown on the bottom of each figure. The ESD protection device comprises a multi-gate E-FET (200~202), at least one first resistor (250~252), and at least one gate capacitor (240 and 241). The multi-gate E-FET comprises a source electrode (S), a drain electrode (D), and plural gate electrodes (G1~G4) disposed between the source and drain electrodes. Each of the plural gate electrodes is DC-connected to the source electrode, the drain electrode, or an inter-gate region between two adjacent gate electrodes through the at least one first resistor. At least one of the plural gate electrodes is AC-connected to the source electrode, the drain electrode, or an inter-gate region between two adjacent gate electrodes through the at least one gate capacitor. In these embodiments, the ESD protection device may further include one or more second resistors (260~262) for connecting two gate electrodes.

FIGS. 2A and 2B are circuit diagrams showing embodiments of a compound semiconductor ESD protection device using a dual-gate E-FET. In FIG. 2A, the gate electrode G1 is DC-connected to the source electrode S through the first resistor 250 and AC-connected to the source electrode S through the gate capacitor 240, and the gate electrode G2 is DC-connected to the source electrode S through the second resistor 260 and the first resistor 250. In FIG. 2B, the gate electrode G1 is DC-connected to the source electrode S through the first resistor 250 and AC-connected to the source electrode S through the gate capacitor 240, and the gate electrode G2 is DC-connected to the drain electrode D through the first resistor 251 and AC-connected to the drain electrode D through the gate capacitor 241.

Figure 3A:
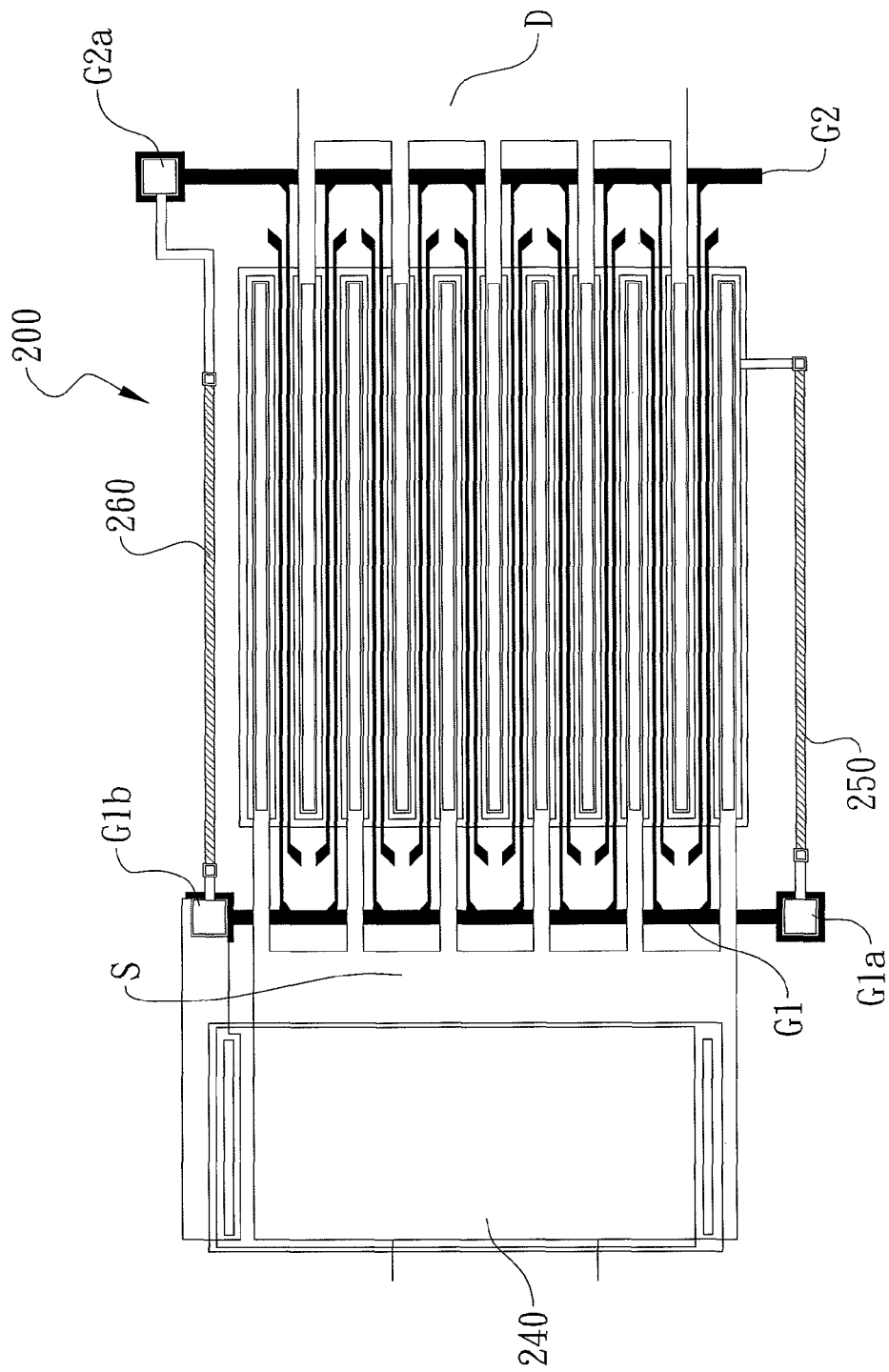
FIGS. 3A and 3B are schematics showing the plan view of two embodiments of the circuit diagram shown in FIG. 2A according to the present invention.

An implementation of the circuit diagram shown in FIG. 2A provided by the present invention is shown in FIG. 3A. In this implementation, the source electrode S and the drain electrode D are multi-finger electrodes with their fingers interposed each other, and dual gate electrodes G1 and G2 are also multi-finger electrodes interposed each other disposed between each pair of a source and a drain electrode fingers. An electrode pad wider than the width of a gate electrode is provided at the end of the gate electrode for the electrical connection to other electrical elements. In this implementation, gate electrode pads G1a and G1b are provided at the two ends of the gate electrode G1 and a gate electrode pad G2a is provided at one of the ends of the gate electrode G2. The gate capacitor 240 is connected to gate electrode pad G1b and the source electrode S. The first resistor 250 is connected to the gate electrode pad G1a and the source electrode finger most close to G1a. The second resistor 260 is connected between gate electrode pads G1b and G2a.

Figure 3B:
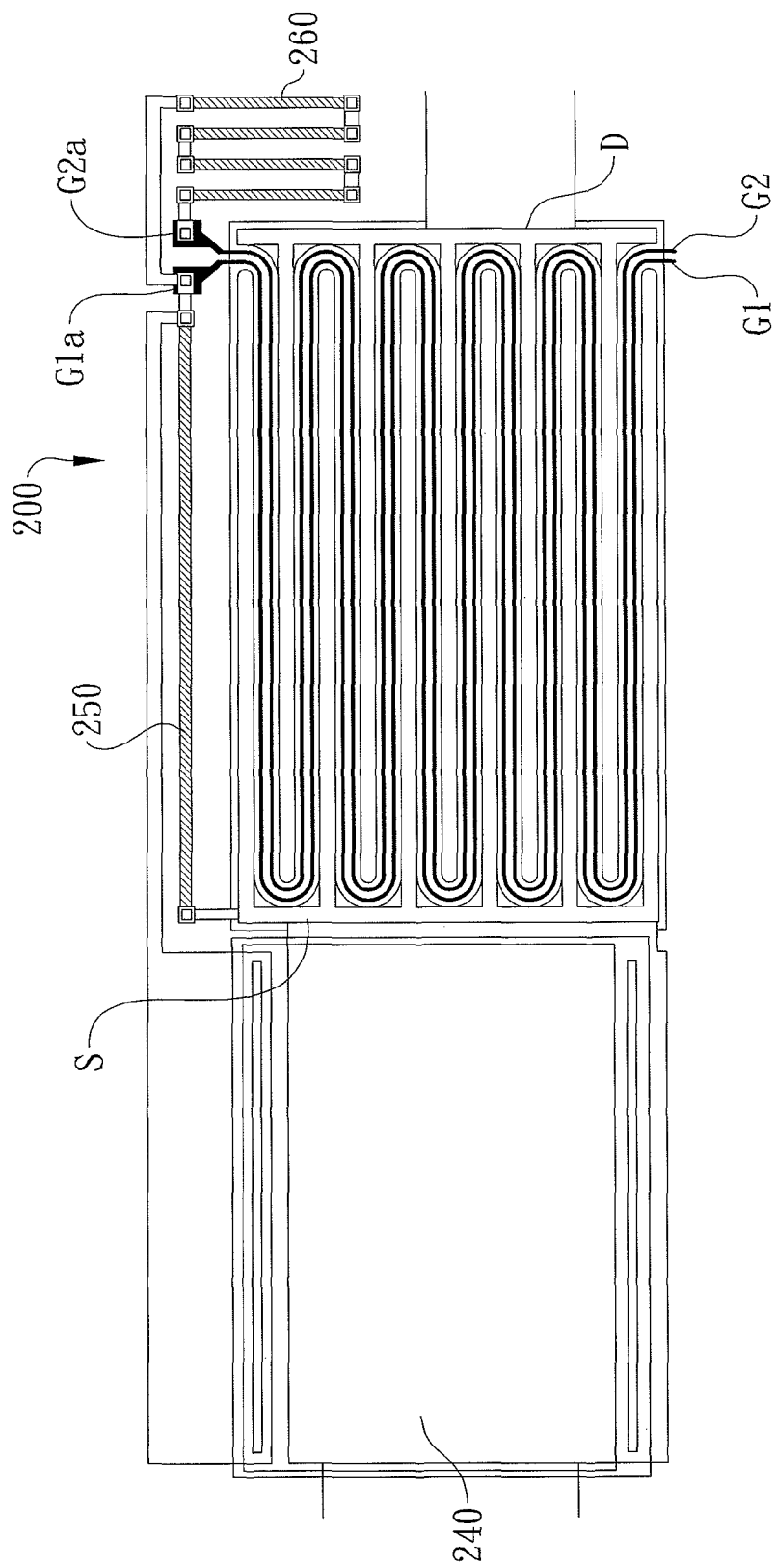

Another implementation of the circuit diagram shown in FIG. 2A provided by the present invention is shown in FIG. 3B. The source electrode S and the drain electrode D are multi-finger electrodes with their fingers interposed each other, and dual gate electrodes G1 and G2 are meandering gate electrodes disposed on the space between each pair of the source and drain electrode fingers. Gate electrode pads G1a and G2a are provided at one end of gate electrodes G1 and G2, respectively. The gate capacitor 240 is connected to the gate electrode pad G1a and the source electrode S. The first resistor 250 is connected to the gate electrode pad G1a and the source electrode finger most close to G1a. The second resistor 260 is connected between gate electrode pads G1a and G2a.

FIG. 4A~4D are circuit diagrams showing various embodiments of a compound semiconductor ESD protection device using a triple-gate E-FET. In FIG. 4A, all three gate electrodes G1~G3 are DC-connected to the source electrode S through the first resistor 250, in which the gate electrode G2 are connected to the first resistor 250 through the second resistor 260, and the gate electrode G3 are connected to the first resistor 250 through second resistors 260 and 261. In FIG. 4A, gate electrode G1 is AC-connected to the source electrode S through the gate capacitor 240. In FIGS. 4B and 4C, gate electrodes G1 and G2 are DC-connected to the source electrode S through the first resistor 250, in which the gate electrode G2 are connected to the first resistor 250 through the second resistor 260. In FIGS. 4B and 4C, gate electrode G1 is AC-connected to the source electrode S through the gate capacitor 240. In FIG. 4B, the gate electrode G3 is DC-connected to a connection node 270 disposed on the inter-gate region between G2 and G3 through the first resistor 251. In FIG. 4C, the gate electrode G3 is DC-connected to the drain electrode D through the first resistor 251. In FIG. 4D, all gate electrodes G1~G3 are DC-connected to the connection node 270 disposed on the inter-gate region between G2 and G3, in which gates G1 and G2 are connected through the first resistor 250 and the gate G3 is connected through the first resistor 251. Gate G2 is AC-connected to the connection node 270 disposed on the inter-gate region between G2 and G3 through the gate capacitor 240.

Figure 5A:
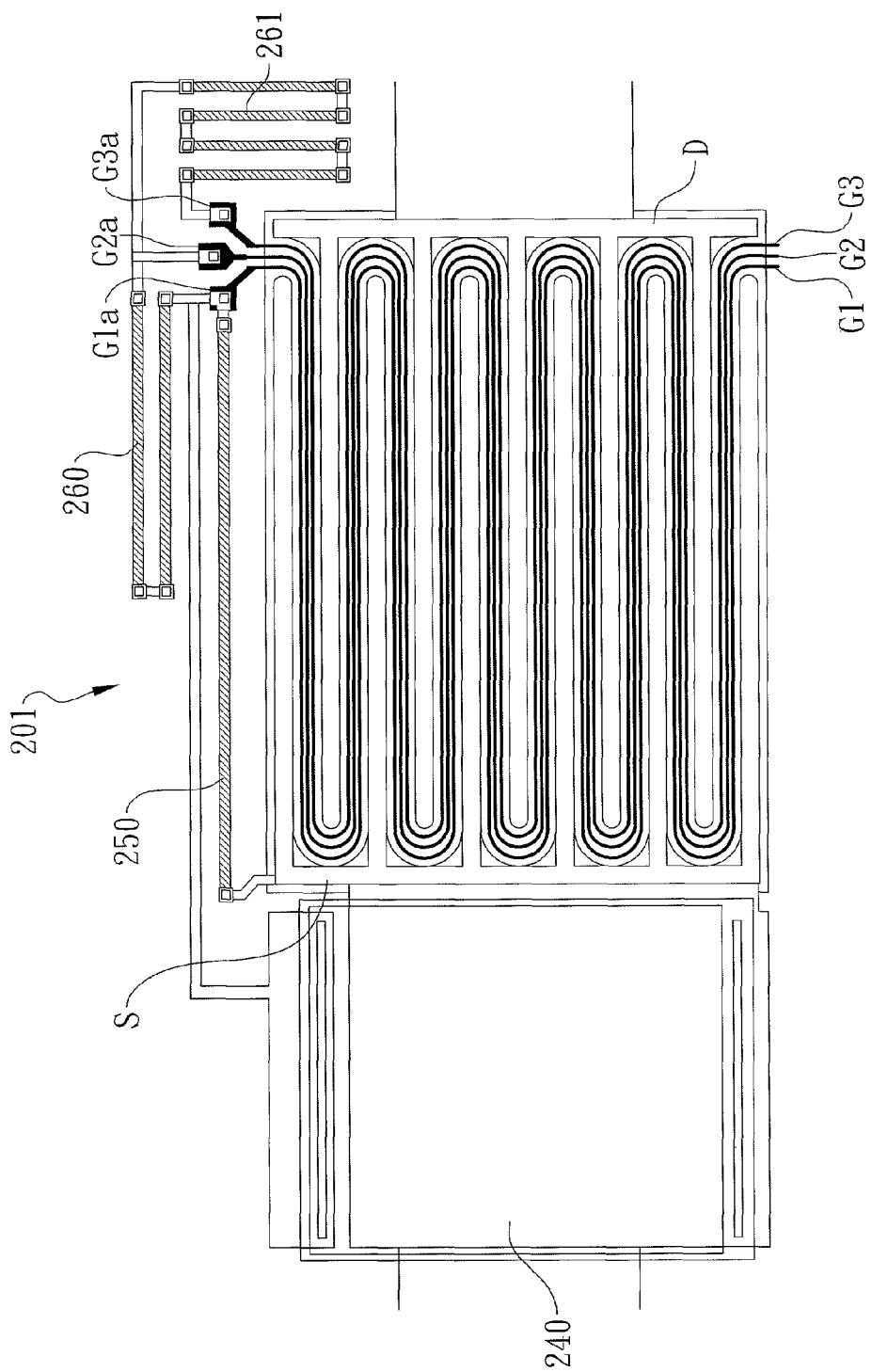
FIGS. 5A and 5B are schematics showing the plan view of embodiments of the circuit diagram shown in FIGS. 4A and 4B, respectively, according to the present invention.

FIG. 5A shows the schematic of an implementation of the circuit diagram shown in FIG. 4A provided by the present invention. The source electrode S and the drain electrode D are multi-finger electrodes with their fingers interposed each other, and the triple gate electrodes G1~G3 are meandering gate electrodes disposed on the space between each pair of the source and the drain electrode fingers. Gate electrode pads G1a~G3a are provided at one end of gate electrode G1~G3, respectively. The gate capacitor 240 is connected to the gate electrode pad G1a and the source electrode S. The first resistor 250 is connected to the gate electrode pads G1a and the source electrode S. The second resistor 260 is connected to the gate electrode pads G1a and G2a. And the second resistor 261 is connected to the gate electrode pads G2a and G3a.

Figure 5B:
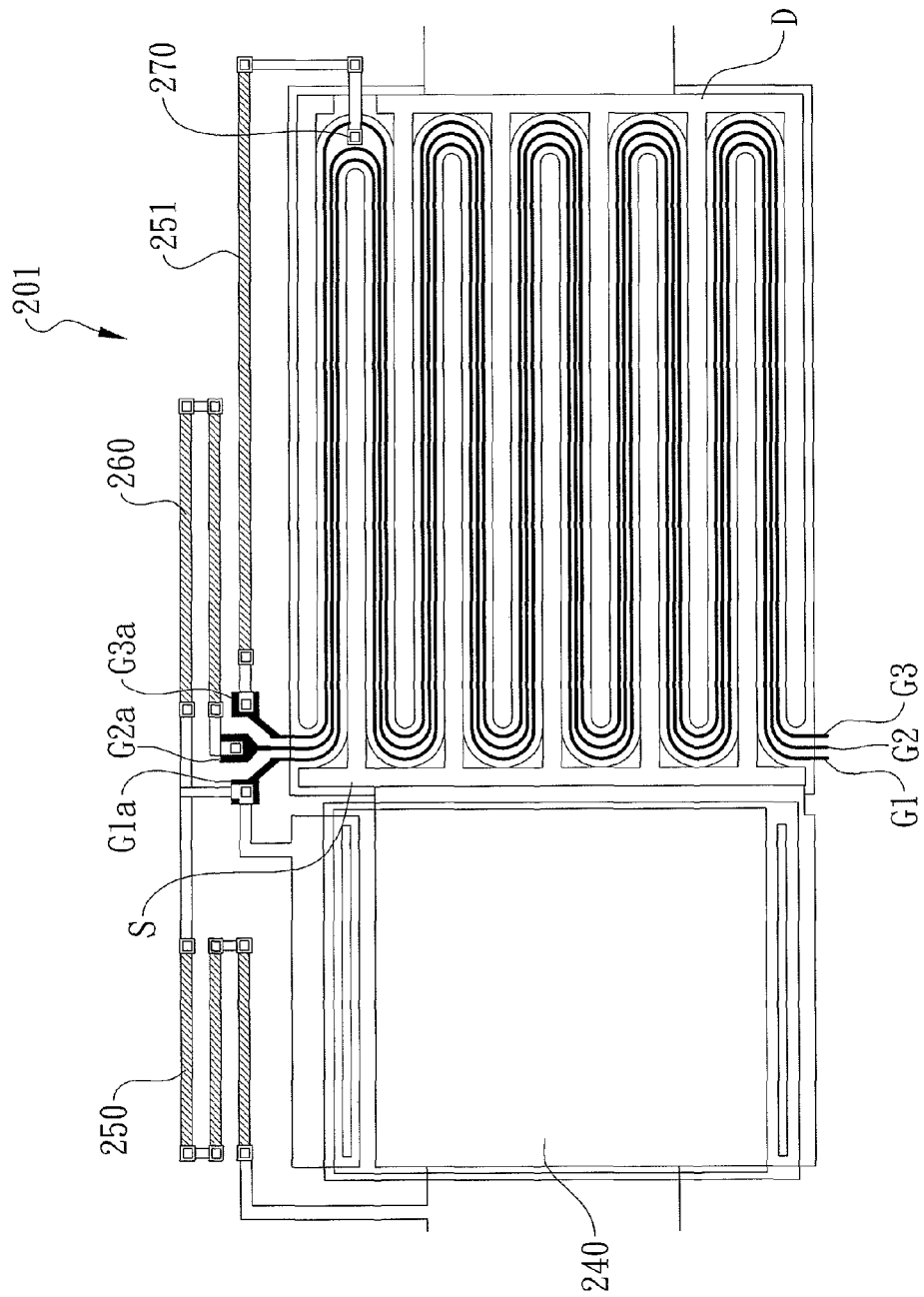

FIG. 5B shows the schematic of an implementation of the circuit diagram shown in FIG. 4B provided by the present invention. The source electrode S and the drain electrode D are multi-finger electrodes with their fingers interposed each other, and the triple gate electrodes G1~G3 are meandering gate electrodes disposed on the space between each pair of the source and drain electrode fingers. Gate electrode pads G1a~G3a are provided at one end of gate electrode G1~G3, respectively. The gate capacitor 240 is connected to the gate electrode pad G1a and the source electrode S. The first resistor 250 is connected to the gate electrode pad G1a and the source electrode S. The second resistor 260 is connected to gate electrode pads G1a and G2a. The connection node 270 is disposed on a turning region which is made wider between gate electrodes G2 and G3. The first resistor 251 is connected to the gate electrode pad G3a and the connection node 270.

Figure 6A:
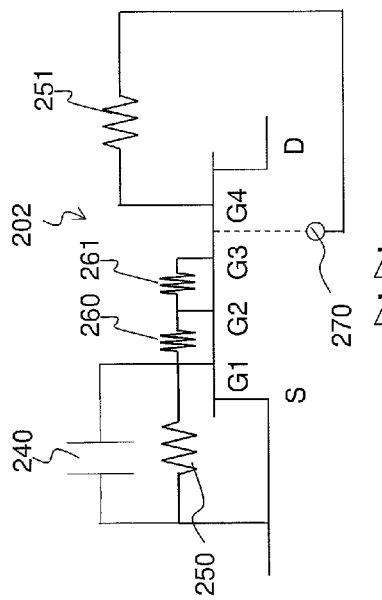
Figure 6B:
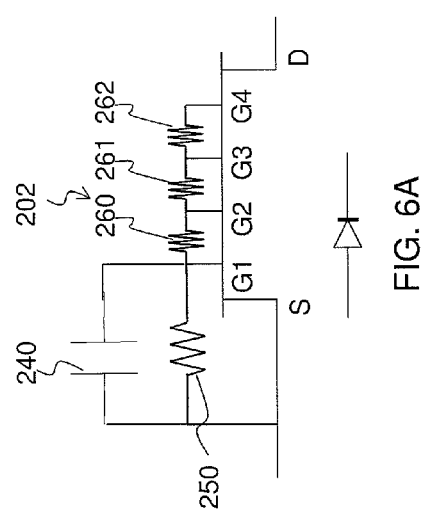
Figure 6C:
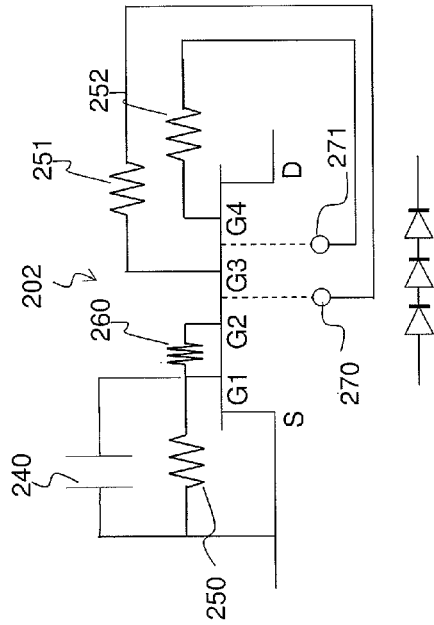
Figure 6D:
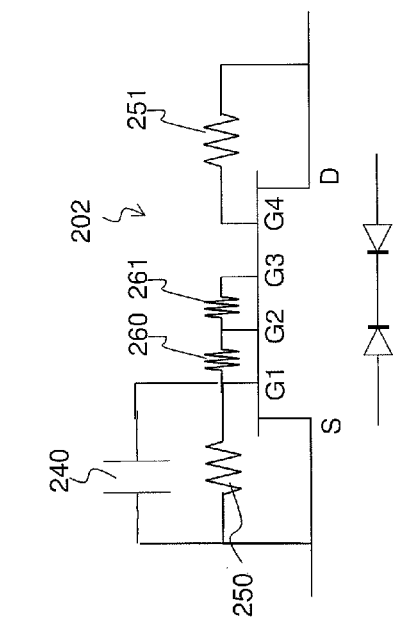

FIG. 6A~6H are circuit diagrams showing embodiments of a compound semiconductor ESD protection device using a quadruple-gate E-FET provided by the present invention. In FIG. 6A, all four gate electrodes G1~G4 are DC-connected to the source electrode S through the first resistor 250, in which the gate electrode G2 are connected to the first resistor 250 through the second resistor 260, the gate electrode G3 are connected to the first resistor 250 through second resistors 260 and 261, and the gate electrode G4 are connected to the first resistor 250 through second resistors 260, 261, and 262. In FIG. 6A, gate electrode G1 is AC-connected to the source electrode S through gate capacitor 240, In FIGS. 6B and 6C, gate electrodes G1~G3 are DC-connected to the source electrode S through the first resistor 250, in which the gate electrode G2 is connected to the first resistor 250 through the second resistor 260, and the gate electrode G3 is connected to the first resistor 250 through second resistors 260 and 261. In FIGS. 6B and 6C, gate electrode G1 is AC-connected to the source electrode S through gate capacitor 240. In FIG. 6B, the gate electrode G4 is DC-connected to a connection node 270 disposed on the inter-gate region between G3 and G4 through the first resistor 251. In FIG. 6C, the gate electrode G4 is DC-connected to the drain electrode D through the first resistor 251. In FIGS. 6D and 6E, gate electrodes G1 and G2 are DC-connected to the source electrode S through the first resistor 250, in which the gate electrode G2 is connected to the first resistor 250 through the second resistor 260. In FIGS. 6D and 6E, gate electrode G1 is AC-connected to the source electrode S through gate capacitor 240. In FIG. 6D, the gate electrode G3 is DC-connected to a connection node 270 disposed on the inter-gate region between G2 and G3 through the first resistor 251, and the gate electrode G4 is DC-connected to a connection node 271 disposed on the inter-gate region between G3 and G4 through the first resistor 252. In FIG. 6E, gate electrodes G3 and G4 are DC-connected to a connection node 270 disposed on the inter-gate region between G2 and G3 through the first resistor 251, in which the gate electrode G4 is connected to the first resistor 251 through the second resistor 261. In FIG. 6F, gate electrodes G1~G3 are DC-connected to a connection node 270 disposed on the inter-gate region between G3 and G4 through the first resistor 250, in which the gate electrode G2 is connected to the first resistor 250 through the second resistor 261 and gate electrode G1 is connected to the first resistor 250 through the second resistors 260 and 261, and the gate G4 is DC-connected to the connection node 270 through the first resistor 251. In FIG. 6F, gate electrode G3 is AC-connected to a connection node 270 disposed on the inter-gate region between G3 and G4 through gate capacitor 240. In FIG. 6G, gate electrodes G1 and G2 are DC-connected to a connection node 270 disposed on the inter-gate region between G2 and G3 through the first resistor 250, in which the gate electrode G1 is connected to the first resistor 250 through the second resistor 260. Gate electrode G2 is AC-connected to a connection node 270 disposed on the inter-gate region between G2 and G3 through gate capacitor 240. The gate G3 and G4 is DC-connected to the connection node 270 through the first resistor 251, in which the gate electrode G4 is connected to the first resistor 251 through the second resistor 261. In FIG. 6H, gate electrodes G1 and G2 are DC-connected to the source electrode S through the first resistor 250, in which the gate electrode G2 is connected to the first resistor 250 through the second resistor 260. Gate electrodes G1 is AC-connected to the source electrode S through gate capacitor 240. Gate electrodes G3 and G4 are DC-connected to the drain electrode D through the first resistor 251, in which the gate electrode G3 is connected to the first resistor 251 through the second resistor 261. Gate electrode G4 is AC-connected to the drain electrode D through gate capacitor 241.

Figure 7:
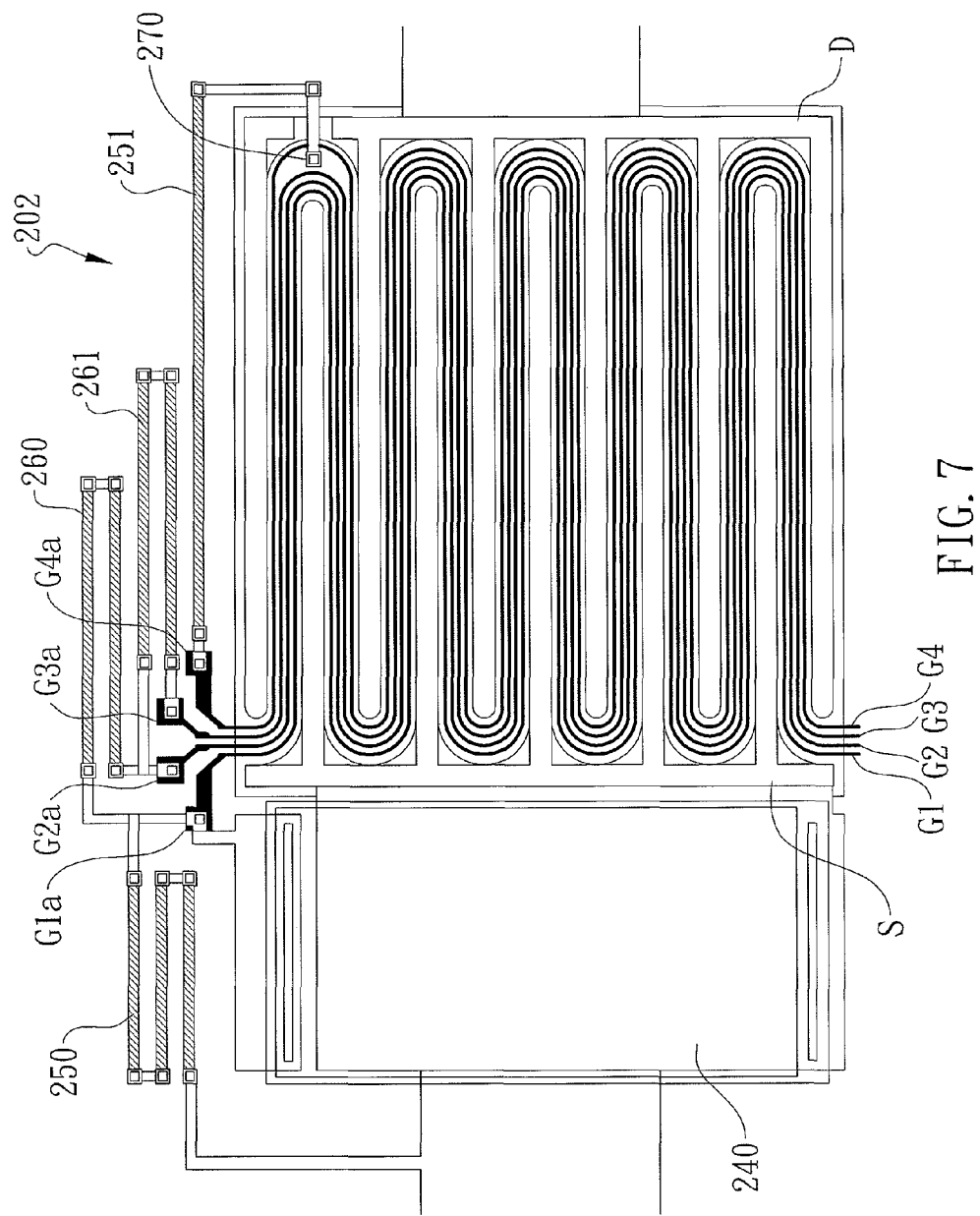
FIG. 7 is a schematic showing the plan view of an embodiment of the circuit diagram shown in FIG. 6B according to the present invention.

FIG. 7 shows an implementation of the circuit diagram shown in FIG. 6B provided by the present invention. The source electrode S and the drain electrode D are multi-finger electrodes with their fingers interposed each other, and the quadruple gate electrodes G1~G4 are meandering gate electrodes disposed on the space between each pair of the source and the drain electrode fingers. Gate electrode pads G1a~G4a are provided at one end of gate electrode G1~G4, respectively. The gate capacitor 240 is connected to the gate electrode pad G1a and the source electrode S. The first resistor 250 is connected to the gate electrode pad G1a and the source electrode S. The second resistor 260 is connected to the gate electrode pad G1a and G2a, and the second resistor 261 is connected to the gate electrode pad G2a and G3a. The connection node 270 is disposed on a turning region which is made wider between gate electrodes G3 and G4. The first resistor 251 is connected to the gate electrode pad G4a and the inter-gate region 270.

The above embodiments of the present invention show the ESD protection device using single multi-gate E-FET. However, the ESD protection device provided by the present invention may use plural multi-gate E-FETs as well. The plural multi-gate E-FETs can be any combination of the multi-gate E-FETs shown in the above embodiments. The ESD protection device provided by the present invention may also use at least one multi-gate E-FETs and at least one single-gate E-FET to construct intended diode connections.

Figure 8A:
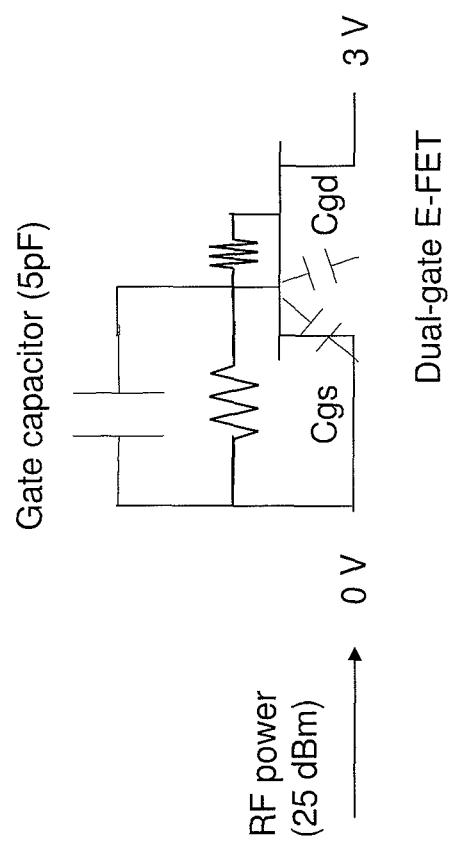
FIG. 8A is a circuit diagram of a compound semiconductor ESD protection device using a dual gates GaAs enhancement-mode pHEMT.
Figure 8B:
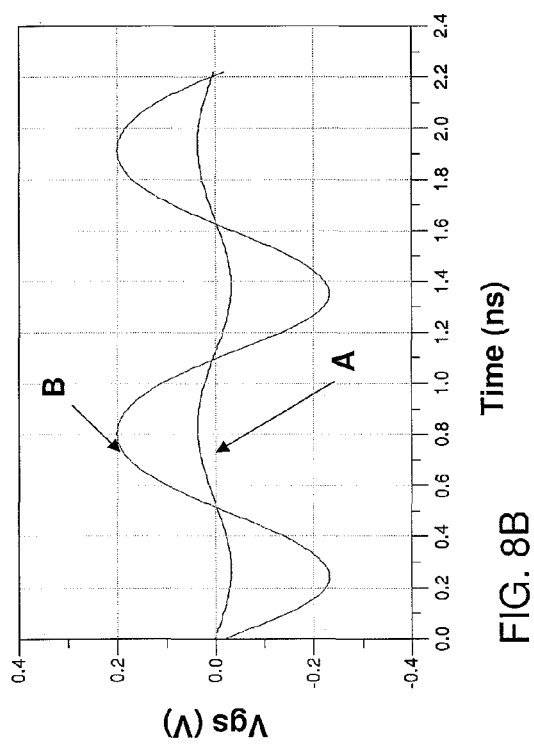
FIGS. 8B and 8C are graphs showing the simulation results of the RF voltage across $C_{gs}$ and $C_{gd}$, respectively, of the dual gates GaAs enhancement-mode pHEMT shown in FIG. 8A with (line A) and without (line B) a gate capacitor.
Figure 8C:
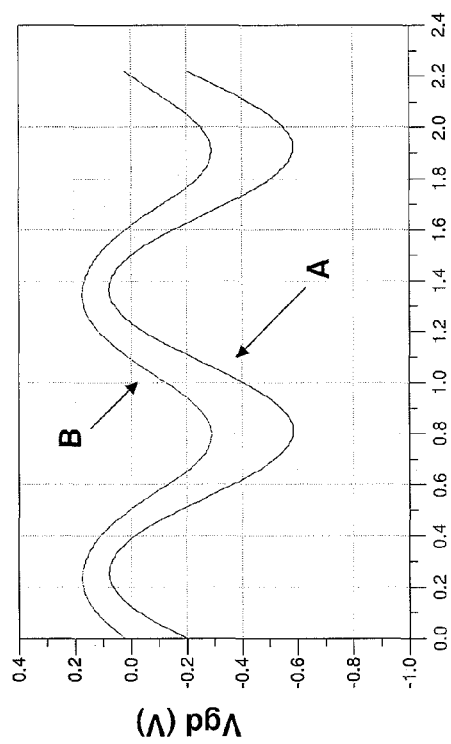
Figure 9:
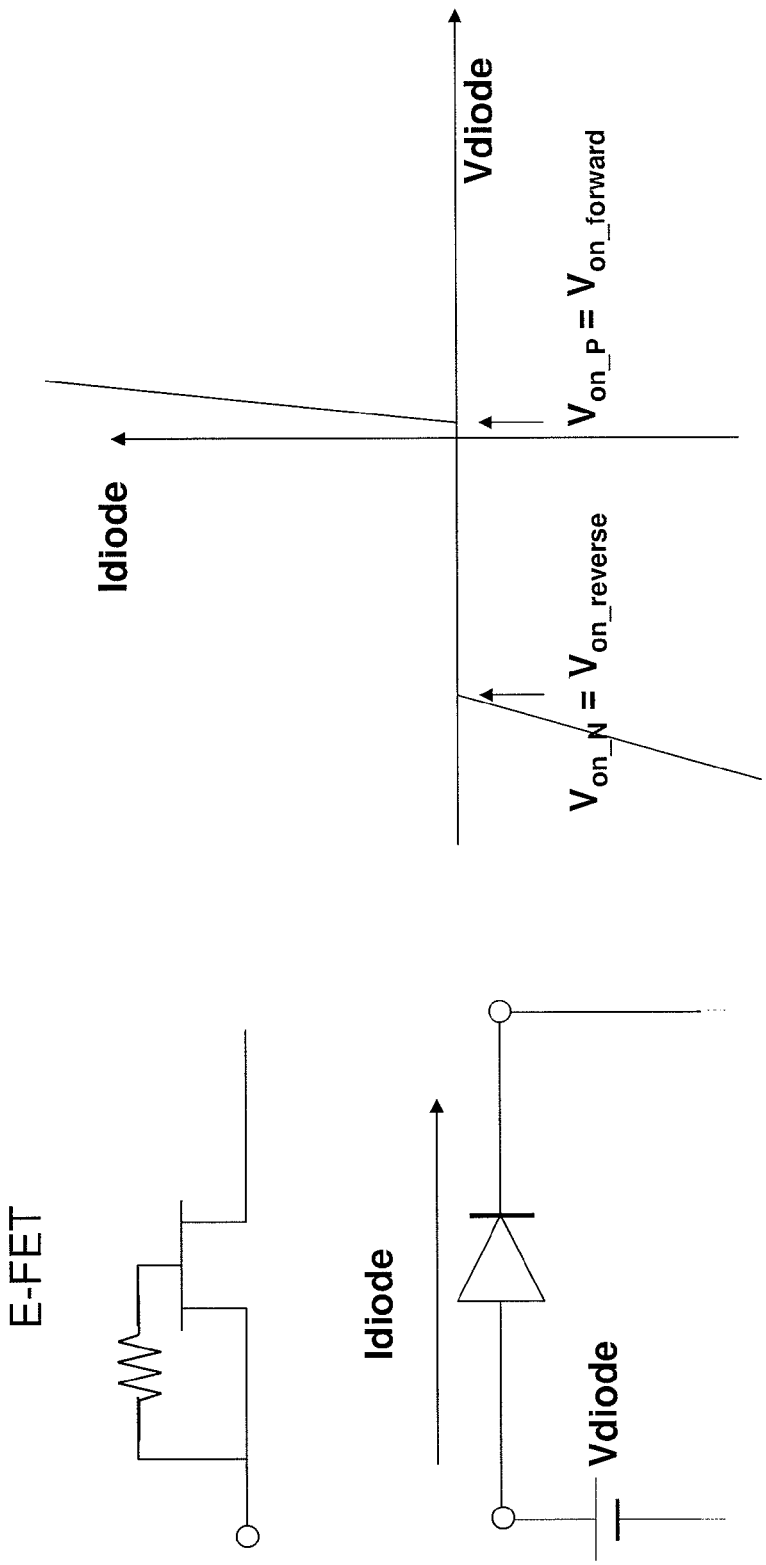
FIG. 9 is a circuit diagram of an E-FET ESD protection device, its equivalent circuit diagram of a diode, and a schematic of its I-V curve provided by a previous technology.

The connections of the gate capacitors in the present invention are in parallel with the parasitic gate capacitance $C_{gs}$ of the FET, as shown by the circuit diagram of a ESD protection device using a dual-gate GaAs enhancement-mode pHEMT in FIG. 8A. It reduces the RF bias voltage across the $C_{gs}$ and the nonlinearity of the signal generated from $C_{gs}$. The gate capacitor also works as a feed-forward capacitor and a fraction of the input RF power is fed to the opposite side of the first gate through the gate capacitor and pumps up positive charges at the inter-gate region electrically floating between two off-state gates. The gate is thus more negatively biased with respect to the inter-gate region to the bias point at which the voltage dependence in the gate capacitance of the first gate on the opposite side $C_{gd}$ is small. FIGS. 8B and 8C show the simulation results on the RF voltage across $C_{gs}$ and $C_{gd}$ shown in FIG. 8A, respectively, with (line A) and without (line B) a gate capacitor. The gate length is 0.5 μm and the gate width is 1 mm. The gate capacitor is of 5 pF. The bias voltage in the simulation is 3V and the RF power is 25 dBm. As shown in FIGS. 8B and 8C, the RF amplitude across $C_{gs}$ is significantly reduced with the gate capacitor, and the DC bias point across $C_{gd}$ is shifted to more negative voltage with the gate capacitor due to the charge pumping. The nonlinear signal from $C_{gs}$ and $C_{gd}$ is thus reduced.

The E-FETs described above, including the single gate and multiple gates E-FETs can be formed by the compound semiconductor material GaAs or GaN. For GaAs E-FETs can be a high electron mobility transistor (HEMT) or a pseudomorphic high electron mobility transistor (pHEMT). The width of each gate electrode of said plural gate electrodes is ranging from 0.1 mm to 10 mm, preferably 1 mm. The resistance of the first and second resistor is ranging from $2 \times 10^2$ to $2 \times 10^4$ ohms, preferably $1 \times 10^3$ to $10 \times 10^3$ ohms. The capacitance of the gate capacitor is ranging from 0.5 to 5 pF, preferably 1 to 3 pF.

To sum up, the present invention can indeed get its anticipated object to provide compound semiconductor ESD protection devices. The present invention has the following advantages:
1. The ESD protection devices provided by the present invention use compound semiconductor single-gate or multi-gate E-FETs or both for the ESD protection, so that the ESD protection circuits for an integrated circuit comprising E-FETs can be integrated together on the same chip. By using the on-chip ESD protection circuits, the size of a compound semiconductor IC can be greatly reduced and the manufacturing process of it can be significantly simplified.
2. The gate capacitor connected between one of the gates and a source electrode, a drain electrode, or an inter-gate region between two adjacent gates in the ESD protection device provided by the present invention reduces the nonlinear signals generated by the voltage-dependent parasitic capacitance associated with the gate electrode said gate capacitor is connected. The linearity of the ESD device under RF operation is thus improved.

The description referred to the drawings stated above is only for the preferred embodiments of the present invention. Many equivalent local variations and modifications can still be made by those skilled at the field related with the present invention and do not depart from the spirits of the present invention, so they should be regarded to fall into the scope defined by the appended claims.

What is claimed is:

1. A compound semiconductor electrostatic discharge (ESD) protection device, comprising:
    a multi-gate enhancement-mode field effect transistor (E-FET), which comprises:
        a source electrode;
        a drain electrode; and
        plural gate electrodes disposed between said source and drain electrodes;
    at least one first resistor, through which each of said plural gate electrodes is DC-connected to said source electrode, said drain electrode, or an inter-gate region between two adjacent gate electrodes; and
    at least one gate capacitor, through which at least one of said plural gate electrodes is AC-connected to said source electrode, said drain electrode, or an inter-gate region between two adjacent gate electrodes,
    wherein two gate electrodes among said plural gate electrodes are connected by a second resistor.

2. The compound semiconductor ESD protection device according to claim 1, wherein said multi-gate E-FET is a GaAs FET.

3. The compound semiconductor ESD protection device according to claim 2, wherein said multi-gate E-FET is a high electron mobility transistor (HEMT) or a pseudomorphic high electron mobility transistor (pHEMT).

4. The compound semiconductor ESD protection device according to claim 1, wherein said multi-gate E-FET is a GaN FET.

5. The compound semiconductor ESD protection device according to claim 1, wherein the width of each gate electrode of said plural gate electrodes is ranging from 0.1 mm to 10 mm.

6. The compound semiconductor ESD protection device according to claim 1, wherein the resistance of said first and second resistors are ranging from $2 \times 10^2$ to $2 \times 10^4$ ohms.

7. The compound semiconductor ESD protection device according to claim 1, Wherein the capacitance of said gate capacitor is ranging from 0.5 to 5 pF.

8. A compound semiconductor electrostatic discharge (ESD) protection i device, comprising:
- a multi-gate enhancement-mode field effect transistor (E-FET), which comprises:
  - a source electrode;
  - a drain electrode; and
  - plural gate electrodes disposed between said source and drain electrodes;
- at least one first resistor, through which each of said plural gate electrodes is DC-connected to said source electrode, said drain electrode, or an inter-gate region between two adjacent gate electrodes; and
- at least one gate capacitor, through which at least one of said plural gate electrodes is AC-connected to said source electrode, said drain electrode, or an inter-gate region between two adjacent gate electrodes,
- wherein said source and drain electrodes are multi-finger electrodes interposed each other, and said plural gate electrodes are multi-finger electrodes interposed each other disposed between said source and drain electrodes.

9. The compound semiconductor ESD protection device according to claim 8, wherein said multi-gate E-FET is a GaAs FET.

10. The compound semiconductor ESD protection device according to claim 9, wherein said multi-gate E-FET is a high electron mobility transistor (HEMT) or a pseudomorphic high electron mobility transistor (pHEMT).

11. The compound semiconductor ESD protection device according to claim 8, wherein said multi-gate E-FET is a GaN FET.

12. The compound semiconductor ESD protection device according to claim 8, wherein the width of each gate electrode of said plural gate electrodes is ranging from 0.1 mm to 10 mm.

13. The compound semiconductor ESD protection device according to claim 8, wherein the resistance of said first resistor is ranging from $2 \times 10^2$ to $2 \times 10^4$ ohms.

14. The compound semiconductor ESD protection device according to claim 8, wherein the capacitance of said gate capacitor is ranging from 0.5 to 5 pF.

15. A compound semiconductor electrostatic discharge (ESD) protection device, comprising:
- a multi-gate enhancement-mode field effect transistor (E-FET), which comprises:
  - a source electrode;
  - a drain electrode; and
  - plural gate electrodes disposed between said source and drain electrodes;
- at least one first resistor, through which each of said plural gate electrodes is DC-connected to said source electrode, said drain electrode, or an inter-gate region between two adjacent gate electrodes; and
- at least one gate capacitor, through which at least one of said plural gate electrodes is AC-connected to said source electrode, said drain electrode, or an inter-gate region between two adjacent gate electrodes,
- wherein said source and drain electrodes are multi-finger electrodes interposed each other, and said plural gate electrodes are meandering gate electrodes disposed between said source and drain electrodes.

16. The compound semiconductor ESD protection device according to claim 15, wherein said multi-gate E-FET is a GaAs PET.

17. The compound semiconductor ESD protection device according to claim 16, wherein said multi-gate E-FET is a high electron mobility transistor (HEMT) or a pseudomorphic high electron mobility transistor (pHEMT).

18. The compound semiconductor ESD protection device according to claim 15, wherein said multi-gate E-FET is a GaN FET.

19. The compound semiconductor ESD protection device according to claim 15, wherein the width of each gate electrode of said plural gate electrodes is ranging from 0.1 mm to 10 mm.

20. The compound semiconductor ESD protection device according to claim 15, wherein the resistance of said first resistor is ranging from $2 \times 10^2$ to $2 \times 10^4$ ohms.

21. The compound semiconductor ESD protection device according to claim 15, wherein the capacitance of said gate capacitor is ranging from 0.5 to 5 pF.

* * * * *